(12) United States Patent
Kang et al.

(10) Patent No.: US 8,697,568 B2
(45) Date of Patent: Apr. 15, 2014

(54) SEMICONDUCTOR CHIP INCLUDING A PLURALITY OF CHIP AREAS AND FABRICATING METHOD THEREOF

(71) Applicant: Samsung Electronics Co., Ltd., Suwon-si (KR)

(72) Inventors: Young Min Kang, Yongin-si (KR); Hyungwoo Kim, Hwaseongi-si (KR); Ki-chul Park, Suwon-si (KR); SangMan Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/647,785

(22) Filed: Oct. 9, 2012

(65) Prior Publication Data

US 2013/0087891 A1  Apr. 11, 2013

(30) Foreign Application Priority Data

Oct. 6, 2011  (KR) .................. 10-2011-0102008

(51) Int. Cl.
 *H01L 21/4763* (2006.01)
(52) U.S. Cl.
 USPC ........... 438/622; 438/462; 438/614; 438/627; 257/620; 257/622; 257/758; 257/484
(58) Field of Classification Search
 USPC .......... 257/E23.002, 750, 751, 774, 758, 508, 257/484, 778, 691, 692, 620, 618, 622, 623, 257/775, 786, 483, 690; 438/140, 128, 129, 438/618, 620, 622, 639, 462, 614, 612, 613, 438/627, 637, 643
 See application file for complete search history.

(56) References Cited

U.S. PATENT DOCUMENTS

| | | | |
|---|---|---|---|
| 2004/0150070 A1* | 8/2004 | Okada et al. | 257/508 |
| 2006/0102980 A1* | 5/2006 | Nakashiba | 257/508 |
| 2011/0027917 A1 | 2/2011 | Shinkawata | |
| 2011/0033787 A1 | 2/2011 | Lin et al. | |

FOREIGN PATENT DOCUMENTS

| | | |
|---|---|---|
| JP | 10-73916 A | 3/1998 |
| JP | 10-312049 A | 11/1998 |
| JP | 11-305418 A | 11/1999 |
| JP | 2011-029498 A | 2/2011 |
| KR | 10-2002-0013068 A | 2/2002 |
| KR | 10-2004-0074311 A | 8/2004 |
| KR | 10-0801745 B1 | 1/2008 |
| KR | 10-2008-0084249 A | 9/2008 |

\* cited by examiner

*Primary Examiner* — Thanh Y Tran
(74) *Attorney, Agent, or Firm* — Sughrue Mion, PLLC

(57) ABSTRACT

Disclosed is a method of fabricating a semiconductor chip. The method includes forming a silicon layer; forming a first layer formed on the silicon layer and including a first seal ring surrounding a first chip area and a second seal ring surrounding a second chip area; and forming a second layer formed on the first layer and including a metal interconnection connecting one of the first and second chip areas and an external terminal.

16 Claims, 5 Drawing Sheets

SEMICONDUCTOR CHIP INCLUDING A PLURALITY OF CHIP AREAS AND FABRICATING METHOD THEREOF

CROSS-REFERENCE TO RELATED APPLICATIONS

A claim for priority under 35 U.S.C. §119 is made to Korean Patent Application No. 10-2011-0102008 filed Oct. 6, 2011, in the Korean Intellectual Property Office, the entire contents of which are hereby incorporated by reference.

BACKGROUND

The exemplary embodiments described herein relate to a semiconductor chip and a fabricating method thereof, and more particularly, relate to a semiconductor chip including a plurality of chip areas and a fabricating method thereof.

In general, a lithography process may be used to fabricate a semiconductor chip. The lithography process may include an expose process, a development process, and an etching process. A mask may be used at the lithography process. A pattern of an integrated circuit may be formed by exposing ultraviolet rays to a silicon layer using a mask.

When various types of semiconductor chips are fabricated, separate masks for the respective semiconductor chips may be required. The reason may be that IC patterns of the respective semiconductor chips are different. Fabrication cost and time of the mask may take up most of a cost and the time needed to fabricate a semiconductor chip. In particular, in a case where a small amount of test chips are fabricated, fabrication cost and time of the mask may have a great effect on fabrication cost.

SUMMARY

One aspect of the exemplary embodiments is directed to provide a method of fabricating a semiconductor chip. The method comprises forming a silicon layer; forming a first layer formed on the silicon layer and including a first seal ring surrounding a first chip area and a second seal ring surrounding a second chip area; and forming a second layer formed on the first layer and including a metal interconnection connecting one of the first and second chip areas and an external terminal.

In example embodiments, the first chip area is smaller in size than the second chip area.

In example embodiments, the first chip area is located within the second chip area.

In example embodiments, the first layer a front end of line (FEOL) layer or a back end of line (BEOL) layer.

In example embodiments, the second layer comprises a global layer connected with one of the first and second chip areas through a via; a bump connected with the global layer and formed to be exposed at an upper surface of the second layer; and a passivation layer formed to coat the remaining portion of the upper surface of the second layer other than a portion exposing the bump.

In example embodiments, the method further comprises a cutting line placed outside the first seal ring to surround the first chip area.

Another aspect of exemplary embodiments is directed to provide a semiconductor chip comprising a silicon layer; a first layer formed on the silicon layer and including a first seal ring surrounding a first chip area and a second seal ring surrounding a second chip area; and a second layer formed on the first layer and including a metal interconnection connecting one of the first and second chip areas and an external terminal.

In example embodiments, the first chip area is smaller in size than the second chip area.

In example embodiments, the first chip area is located within the second chip area.

In example embodiments, the first layer a front end of line (FEOL) layer or a back end of line (BEOL) layer.

In yet another exemplary embodiment, there may be a method of fabricating a semiconductor chip, including: forming a silicon layer; forming a first layer on the silicon layer, the first layer including a first seal ring surrounding a first area and a second seal ring surrounding a second area; and forming a second layer on the first layer, the second layer including a metal interconnection connecting an external terminal and one of the first and the second areas.

In an exemplary embodiment, there is a semiconductor chip including: a silicon layer; a first layer formed on the silicon layer, the first layer including a first seal ring surrounding a first area and a second seal ring surrounding a second area; and a second layer formed on the first layer, the second layer including a metal interconnection connecting an external terminal and one of the first and the second areas.

In one exemplary embodiment, there is a method of fabricating a plurality of semiconductor chips, including: forming a base layer; forming a first layer on the base layer, the first layer including a first barrier disposed about a first area and a second barrier disposed about a second area; forming a second layer on the first layer, the second layer including a metal interconnection connecting a terminal and one of the first and the second areas; and separating a portion of the second area from the first area along a portion of the first barrier.

BRIEF DESCRIPTION OF THE FIGURES

The above and other aspects and features will become apparent from the following description with reference to the following figures, wherein like reference numerals refer to like parts throughout the various figures unless otherwise specified, and wherein.

DETAILED DESCRIPTION

Figure 1:
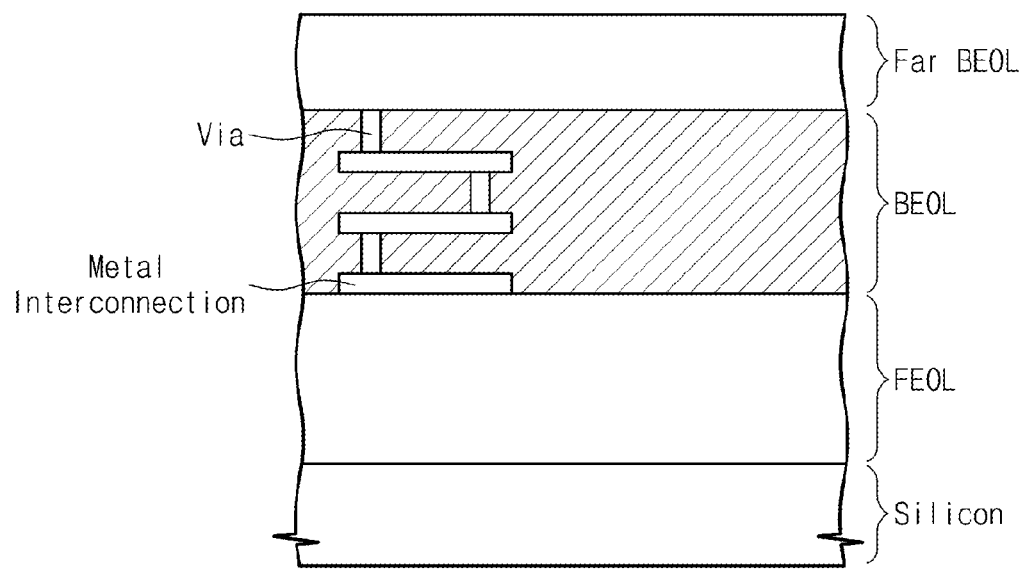
FIG. 1 is a cross-sectional view illustrating a semiconductor chip.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross-sectional view illustrating a semiconductor chip. Referring to FIG. 1, a semiconductor chip may include a silicon layer, a front end of line (FEOL) layer, a back end of line (BEOL) layer, and a far BEOL layer.

The silicon layer, or a base layer, may be formed on a semiconductor substrate, and may include a source and a drain of a transistor. The FEOL layer may be formed on the silicon layer, and may include contacts for the source and drain formed at the silicon layer. The BEOL layer may be formed on the FEOL layer, and may include a metal interconnection, a via hole, and the like. The far BEOL layer may be formed on the BEOL layer, and may include a metal interconnection layer for connecting a semiconductor chip package and an external terminal and a passivation layer, e.g., a protective layer, for coating.

Upon fabricating a semiconductor chip, the silicon layer, the FEOL layer, the BEOL layer, and the far BEOL layer may be sequentially formed in the aforementioned order. Also, the silicon layer, the FEOL layer, the BEOL layer, and the far BEOL layer can internally include a plurality of layers including a semiconductor layer, a metal layer, or an insulation layer.

Figure 2:
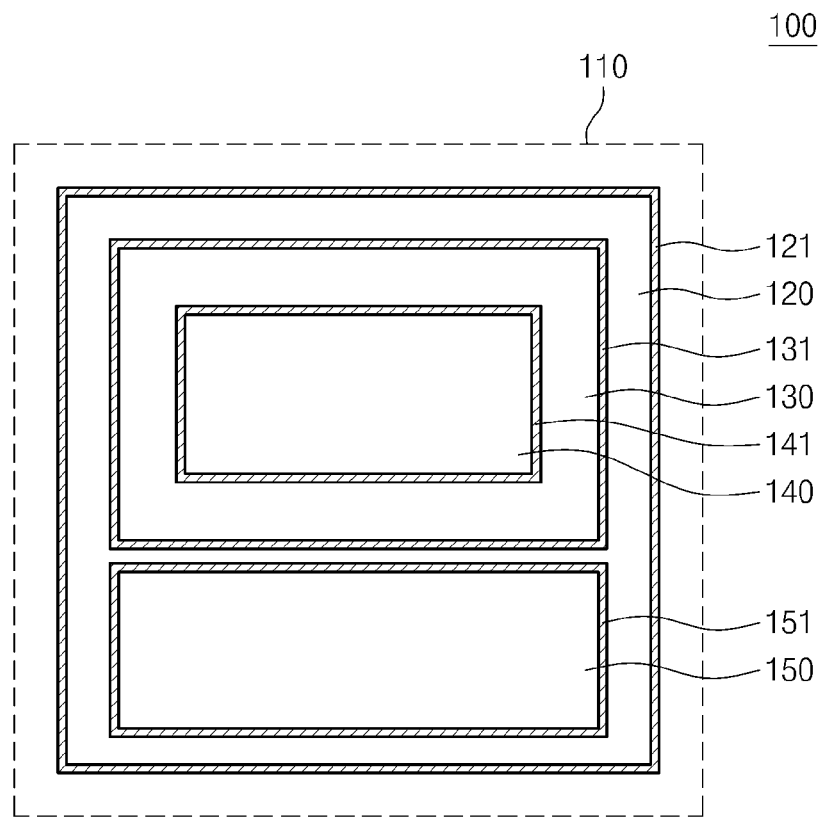
FIG. 2 is a top view of a FEOL layer or a BEOL layer of a semiconductor chip according to an exemplary embodiment.

FIG. 2 is a top view of a FEOL layer or a BEOL layer of a semiconductor chip according to an exemplary embodiment. Referring to FIG. 2, a semiconductor chip 100 may include a plurality of seal rings at a FEOL layer or a BEOL layer.

A portion surrounded by each seal ring may form an independent chip area. For example, a portion surrounded by a first seal ring 141 may form a first chip area 140, a portion surrounded by a second seal ring 131 may form a second chip area 130, a portion surrounded by a third seal ring 121 may form a third chip area 120, and a portion surrounded by a fourth seal ring 151 may form a fourth chip area 150. In one exemplary embodiment, each of the chip areas are non-overlapping in that an outer boundary of a chip area is defined by one seal ring and an inner boundary of a chip area is defined by another seal ring disposed that may be disposed inside the one seal ring. In another exemplary embodiment, the each of the chip areas may be overlapping in that all of the area inside one seal ring would be considered to be of one chip area.

In FIG. 2, there may be illustrated an example that the semiconductor chip 100 includes four seal rings 121, 131, 141, and 151. However, the exemplary embodiments are not limited thereto. For example, the semiconductor chip 100 can include more or less than four seal rings. The four seal rings 121, 131, 141, and 151, may be disposed to take up a total area that is less than a size 110 of a mask. As shown in FIG. 2, the seal rings 121, 131, 141, and 151 may or may not be concentrically disposed. In the present exemplary embodiment, the seal rings 121, 131, 141, and 151 are rectangular shaped, but are not necessarily limited thereto. In another exemplary embodiment, the seal ring may have other polygonal shapes such as square, triangle, pentagon, hexagon, etc., other non-symmetric polygonal shapes, or other non-polygonal shapes, as long as the shapes are conducive to protecting the areas inside the seal ring and to reducing cost and time in manufacturing semiconductor chips.

Integrated circuits may be formed at the chip areas 120, 130, 140, and 150 defined by the seal rings 121, 131, 141, and 151, respectively. Portions belonging to the chip areas 120, 130, 140, and 150 may operate independently from the others of the chip areas 120, 130, 140, and 150. For example, the first chip area 140 may operate independently from the other chip areas 120, 130, and 150, with the exception of the first chip area 140.

Likewise, the second chip area 130 may operate independently from the other chip areas 120, 140, and 150, with the exception of the second chip area 130. Likewise, the third chip area 140 may operate independently from the other chip areas 120, 130, 150 with the exception of the third chip area 140, and the fourth chip area 150 may operate independently from the other chip areas 120, 130, and 140 with the exception of the fourth chip area 150.

One of the chip areas 120, 130, 140, and 150 may be selected as a constituent element of the semiconductor chip 100. For example, the first chip area 120 may be selected as a constituent element of the semiconductor chip 100 by cutting outside portions of the first chip area 120. In example embodiments, the second to fourth chip areas 130 to 150 may be excluded from an operation of the semiconductor chip 100 by disconnecting the outside portions of the first chip area 120 from a far BEOL layer (refer to FIG. 1).

Likewise, a portion not corresponding to the second chip area 130 may be excluded by cutting outside portions of the second chip area 130 or through disconnection from the far BEOL layer. In this case, the second chip area 130 can include the first chip area 120. In example embodiments, the second chip area 130 cannot include the first chip area 120 by disconnecting the first chip area 120 from the far BEOL layer or cutting the first chip area 120.

With the above-described structure, a semiconductor package may include a plurality of semiconductor chips by forming the plurality of semiconductor chips at the first to fourth chip areas 120 to 150, respectively. The semiconductor package may operate as one of the semiconductor chips formed at the first to fourth chip areas 120 to 150 by connecting the far BEOL layer with a required chip area. For example, first to fourth semiconductor chips may be formed at the first to fourth chip areas 120 to 150, respectively. If the first chip area 120 is connected with the far BEOL layer, the semiconductor chip may operate as a first semiconductor chip. Thus, it is possible to form a plurality of semiconductor chips at one semiconductor chip package. A semiconductor chip may operate as one of a plurality of semiconductor chips according to a far BEOL layer forming method.

Also, a FEOL layer and a BEOL layer enabling the semiconductor chip 100 to operate as first to fourth semiconductor chips may be identical in structure. Only, the semiconductor chip 100 may operate as one of the first to fourth chips by changing a structure of the far BEOL layer. Thus, the FEOL and BEOL layers for the first to fourth semiconductor chips may be formed using the same mask. In this case, a mask for the far BEOL layer may be fabricated separately with respect to the first to fourth semiconductor chips. As a result, although various types of semiconductor chips are fabricated, a cost and a time taken to fabricate may be reduced.

Figure 3:
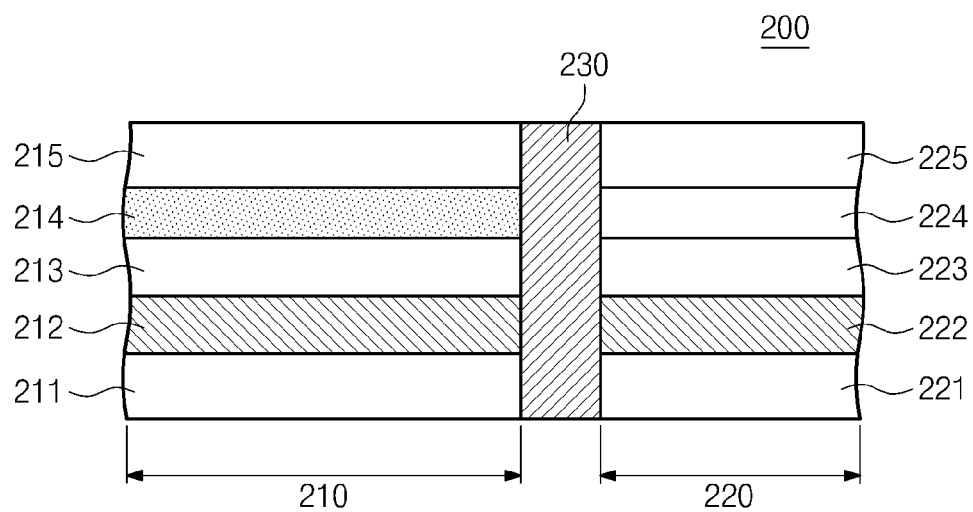
FIG. 3 is a cross-sectional view of a FEOL layer or a BEOL layer according to an exemplary embodiment.

FIG. 3 is a cross-sectional view of a FEOL layer or a BEOL layer according to an exemplary embodiment. Referring to FIG. 3, a semiconductor chip 200 may include a first chip area 210 and a second chip area 220 divided by a first seal ring 230. The first seal ring 230, the first chip area 210, and the second chip area 220 in FIG. 3 may correspond to a first seal ring 141, a first chip area 140, and a second chip area 130 in FIG. 2, respectively.

Each of the first and second chip areas 210 and 220 may include a plurality of layers. In example embodiments, the first chip area 210 may include five layers 211 to 215, and the second chip area 220 may include five layers 221 to 225. Each of the layers included in each of the first and second chip areas 210 and 220 may be an insulation layer, a metal interconnection layer, a via layer, or a silicon layer.

The first chip area 210 may operate as an independent semiconductor chip by forming an integrated circuit at the layers 211 to 215 included in the first chip area 210. Likewise, the second chip area 220 may operate as an independent semiconductor chip by forming an integrated circuit at the layers 221 to 225 included in the second chip area 220.

In example embodiments, the second chip area 220 can be formed to include the first chip area 210. On the other hand, the second chip area 220 can be formed not to include the first chip area 210. In the latter case, the first chip area 210 may be separated from the second chip area 220 by cutting the first seal ring 230. The second chip area 220 may be used for an operation of the semiconductor chip 200 by connecting the second chip area 220 with a far BEOL layer (refer to FIG. 1) and disconnecting the first chip area 210 from the far BEOL layer.

Although not shown in FIG. 3, a second seal ring may be formed outside the second chip area 220. That is, the second seal ring may be formed to surround the second chip area 220.

Figure 4:
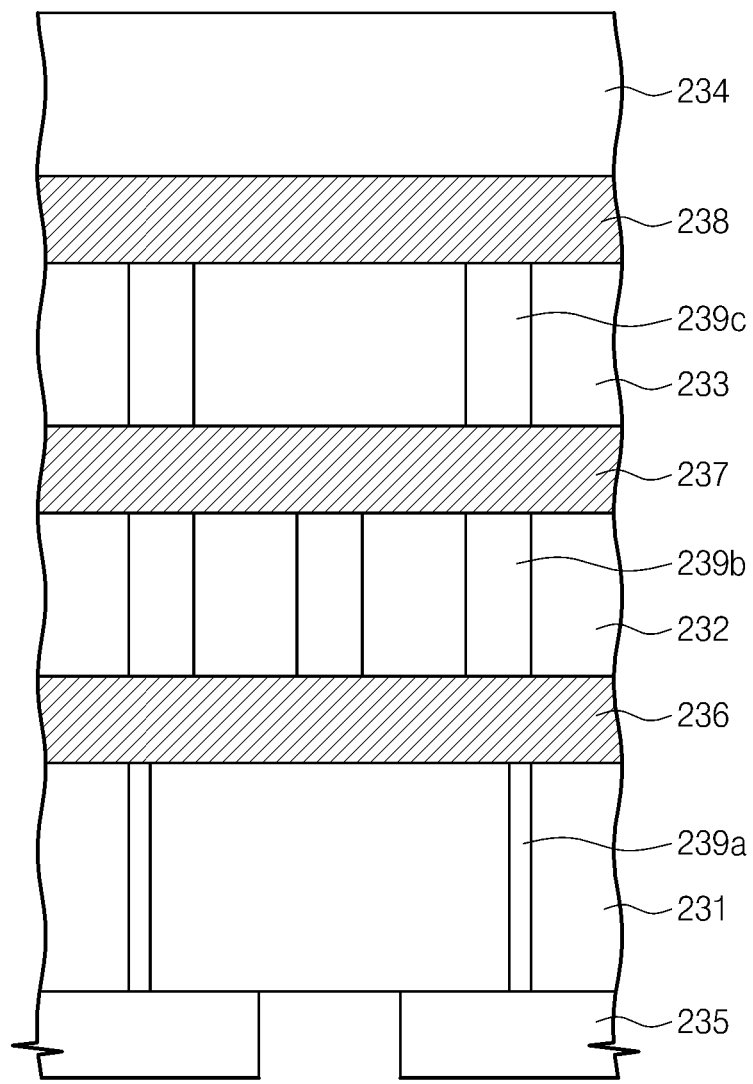
FIG. 4 is a cross-section view of a first seal ring illustrated in FIG. 3.

FIG. 4 is a cross-section view of a first seal ring illustrated in FIG. 3. Referring to FIG. 4, a first seal ring 230 may include first, second, third and fourth insulation films 231, 232, 233 and 234, first, second and third metal layers 236, 237, and 238, first, second and third via holes 239a, 239b, and 239c, and a device isolation film 235.

The device isolation film 235 may define a seal ring area, and a first seal ring area and a peripheral semiconductor substrate may be divided by the device isolation film 235. The first insulation film 231, the first metal layer 236, the second insulation film 232, the second metal layer 237, the third insulation film 233, the third metal layer 238, and the fourth insulation film 234 may be sequentially formed stacked on the device isolation film 235.

The first insulation film 231 may include the first via hole 239a connected with the first metal layer 236. The second insulation film 232 may include the second via hole 239b connecting the first metal layer 236 and the second metal layer 237. The third insulation film 233 may include the third via hole 239c connecting the second metal layer 237 and the third metal layer 238.

The first chip area 210 may be electrically separated from an outer area through the above-described vertical structure. Also, it is possible to shield the first chip area 210 from external moisture and impurity. The first chip area 210 may be prevented from being damaged by changes in an external environment and an external impact.

In FIGS. 3 and 4, the semiconductor chip 200 may be formed such that the first chip area 210 and the second chip area 220 are divided by the first seal ring 230. Thus, the semiconductor chip 200 may be used as different semiconductor chips by selecting the first chip area 210 or the second chip area 220.

For example, if the first chip area 210 is connected with a far BEOL layer (refer to FIG. 1), the semiconductor chip 200 may be implemented by an integrated circuit formed at the first chip area 210. In this case, an outer portion (the remaining portion of the second chip area 220 other than the first chip area) of the first chip area 210 may be a dummy area. On the other hand, if the second chip area 220 is connected with the far BEOL layer, the semiconductor chip 200 may be implemented by an integrated circuit formed at the second chip area 220. In this case, the second chip area 220 may include the first chip area 210.

As a result, different types of semiconductor chips may be fabricated using the same FEOL and BEOL layers. That is, when a plurality of semiconductor chips is fabricated, a cost and a time taken to fabricate a mask used at a semiconductor chip fabricating process may be reduced.

Figure 5:
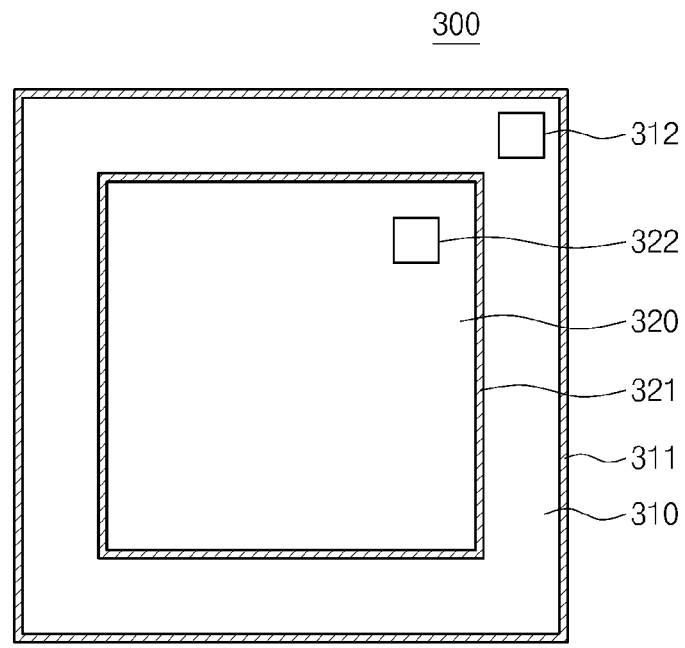
FIG. 5 is a top view of a FEOL layer or a BEOL layer of a semiconductor chip according to another exemplary embodiment.

FIG. 5 is a top view of a FEOL layer or a BEOL layer of a semiconductor chip according to another exemplary embodiment. Referring to FIG. 5, a semiconductor chip 300 may include first and second seal rings 321 and 311, first and second chip areas 320 and 310, and first and second test keys 322 and 312. The first test key 322 may be disposed at the first chip area 320, and the second test key 312 may be disposed at the second chip area 310. An integrated circuit may be formed at each of the first and second chip areas 320 and 310. That is, the first and second chip areas 320 and 310 may form independent semiconductor chips, respectively.

The first test key 322 may be a device for testing whether an integrated circuit formed at the first chip area 320 operates normally. The second test key 312 may be a device for testing whether an integrated circuit formed at the second chip area 310 operates normally.

The first and second chip areas 320 and 310 may be electrically isolated by the first seal ring 321. Thus, the first test key 322 may test an operation of the first chip area 320 without influence or interference from the second chip area 310. Likewise, the second chip area 310 may be separated from an outside portion of the second chip area 310 by the second seal ring 311. The second test key 312 may test an operation of the second chip area 310 without influence or interference from the outside portion of the second chip area 310.

With the above description, it is possible to test a plurality of semiconductor chips formed at a semiconductor chip, independently. In FIG. 5, there may be illustrated an example that two semiconductor chips are included. However, the exemplary embodiments are not limited thereto. For example, a semiconductor chip can be formed to internally include two or more different semiconductor chips. Further, the first and the second seal rings 321 and 311 are concentrically disposed in one exemplary embodiment. In another exemplary embodiment, the first and the second seal rings 321 and 311 are not concentrically disposed.

Figure 6:
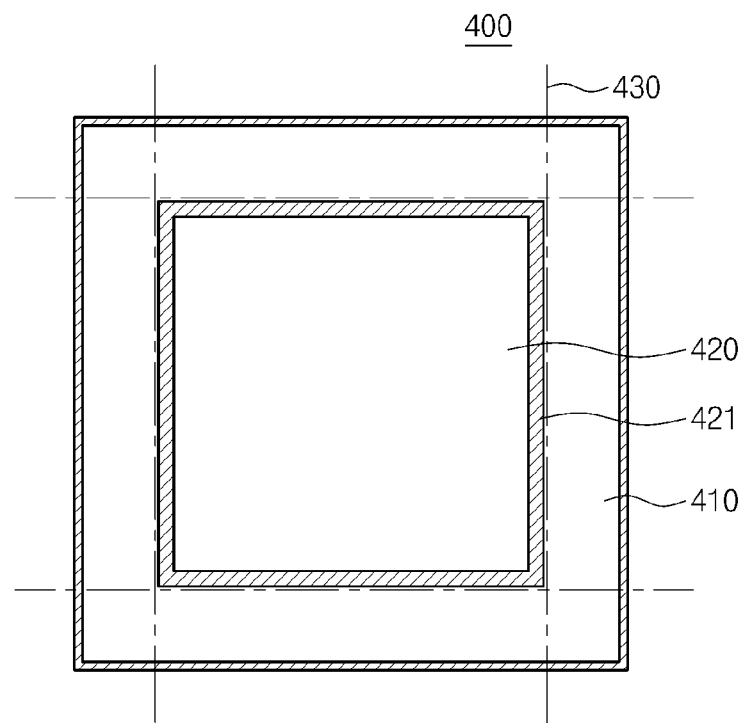
FIG. 6 is a top view of a FEOL layer or a BEOL layer of a semiconductor chip according to still another exemplary embodiment.

FIG. 6 is a top view of a FEOL layer or a BEOL layer of a semiconductor chip according to still another exemplary embodiment. Referring to FIG. 6, a semiconductor chip 400 may include first and second chip areas 420 and 410 and a first seal ring 421. The first and second chip areas 420 and 410 and the first seal ring 421 may be substantially identical to those in FIG. 5 except for the following difference.

As illustrated in FIG. 6, a cutting line 430 may be formed along a boundary of the first seal ring 421. In example embodiments, in a case where the semiconductor chip 400 is cut along the cutting line 430, the first seal ring 421 may prevent the formation of a crack or prevent chipping in the first chip area 420.

The cutting line 430 may be used to separate the first chip area 420 from an outside portion of the first chip area 420. The first chip area 420 having a small size may be separated to be used as a separate semiconductor chip by cutting the semiconductor chip 400 along the cutting line 430.

With the above configuration, a required one of a plurality of semiconductor chips formed at a semiconductor chip may be cut along a seal ring to be separated. In one exemplary embodiment, the cutting line 430 is adjacent to one side of the seal ring as shown in FIG. 6. In another exemplary embodiment, the semiconductor chip may be separated into multiple semiconductor chips via singulation using one of breaking, shearing, nibbling, punching, routing and sawing methods.

Figure 7:
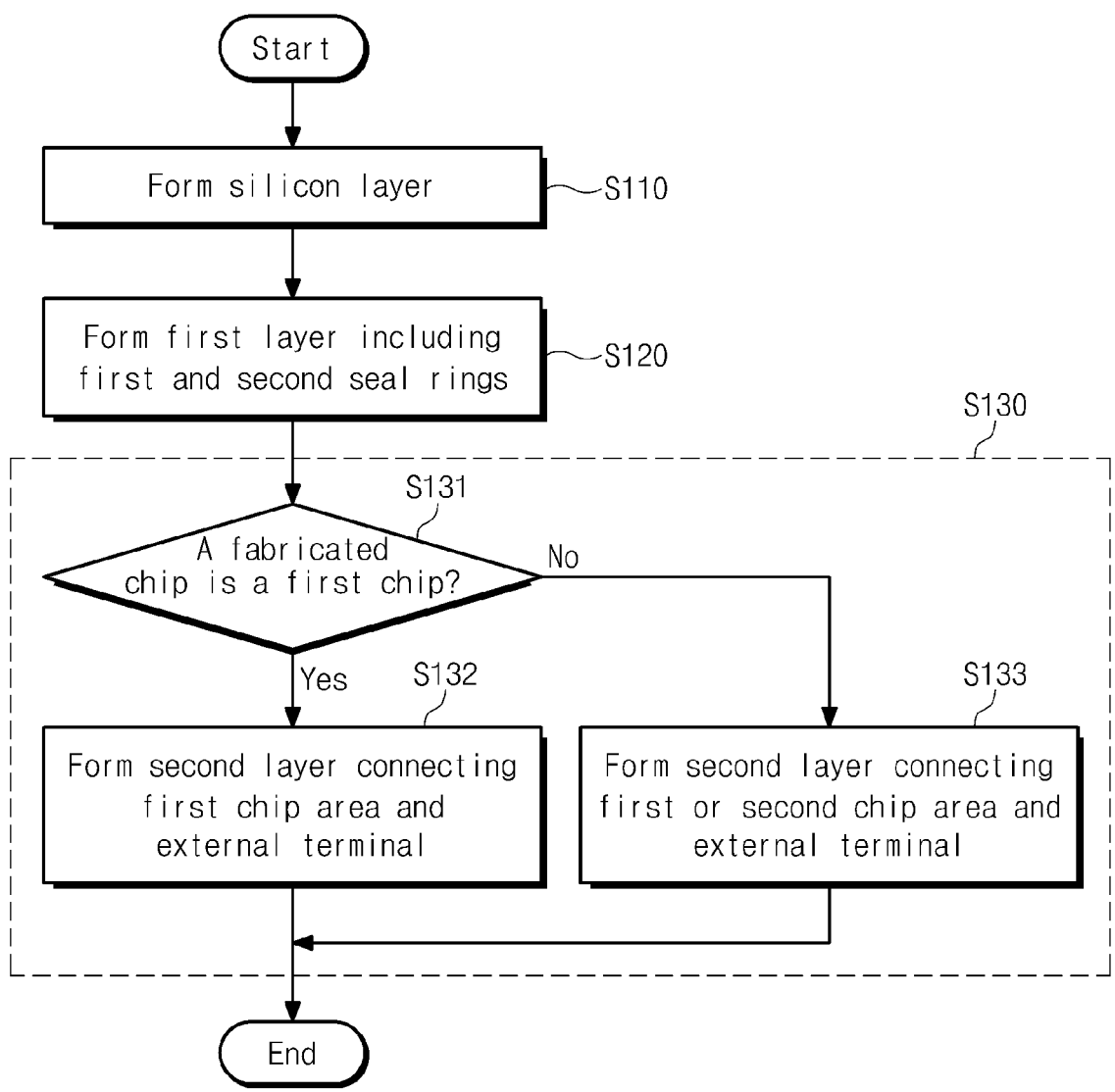
FIG. 7 is a flowchart illustrating a semiconductor chip fabricating method according to an exemplary embodiment.

FIG. 7 is a flowchart illustrating a semiconductor chip fabricating method according to an exemplary embodiment.

In operation S110, a silicon layer may be formed on a semiconductor substrate. The silicon layer may include a source and a drain of a transistor.

In operation S120, a first layer including first and second seal rings may be formed on the silicon layer. The first layer may include a FEOL layer and a BEOL layer. The FEOL layer may be formed on the silicon layer, and may include contacts for the source and drain formed at the silicon layer. The BEOL layer may be formed on the FEOL layer, and may include a metal interconnection, a via hole, and the like.

The first seal ring and the second seal ring may be formed to include a specific area of a semiconductor chip. The first seal ring and the second seal ring may be formed not to be overlapped. In this case, an area included within the first seal ring may be a first chip area, and an area include within the second seal ring may be a second chip area.

In example embodiments, the first seal ring and the first chip area may be formed within the second chip area.

In example embodiments, the first or second seal ring may include a cutting line for separating of the first chip area or the second chip area.

The first and second seal rings, the first and second chip areas, and the cutting line may be as described above.

Herein, two seal rings and chip areas may be exemplarily described.

However, the exemplary embodiments are not limited thereto. For example, two or more seal rings and chip areas can be formed at the first layer.

In operation S130, a second layer for connecting the first layer with an external device may be formed on the first layer. The second layer may include a metal interconnection connecting the first or second chip area formed at the first layer with an external terminal.

In example embodiments, the second layer may be a far BEOL layer.

In example embodiments, the second layer may include a global layer connected with the first or second chip area through a via, a bump connected with the global layer and exposed on an upper surface of the second layer, and a passivation layer coating the remaining portion of the upper surface of the second layer other than a portion exposing the bump.

Below, an operation S130 will be more fully described. It is assumed that the first chip area is included within the second chip area.

In operation S131, whether a required semiconductor chip is formed at the first chip area may be judged. If so, the method proceeds to operation S132. If not (when a required semiconductor chip is formed at the second chip area), the method proceeds to operation S133.

In operation S132, a metal interconnection may be formed at the second layer to connect the first chip area and an external terminal. At this time, the second chip area may not be connected with the external terminal, and may be a dummy area. In example embodiments, the first chip area may be separated from the dummy area (i.e., the second chip area) by cutting the semiconductor chip along the first seal ring.

In operation S133, a metal interconnection may be formed at the second layer to connect the first or second chip area and an external terminal. At this time, if all integrated circuits formed at the first and second chip areas are used, the first and second chip areas may be connected with an external terminal. On the other hand, if an integrated circuit formed at the first chip area is not used, the first chip area may not be connected with an external terminal. In this case, the second chip area may be connected with an external terminal.

As understood from the above description, a plurality of different semiconductor chips may be formed within one semiconductor chip. Thus, since FEOL and BEOL layers for various types of semiconductor chips are formed by the same fabricating process, a cost and a time taken to fabricate a mask and a semiconductor chip may be reduced.

As one exemplary embodiment, the first chip area is included within the second chip area. The first and second chip areas may be formed not to be overlapped. In this case, in operation S133, a metal interconnection may be formed at the second layer to connect the second chip area and an external terminal. On the other hand, as a dummy area, the first chip area may not be connected with an external terminal.

The FEOL layer, BEOL layer, and far BEOL layer may be the same as described above.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of fabricating a semiconductor chip, comprising:
    forming a silicon layer;
    forming a first layer on the silicon layer, the first layer including a first seal ring surrounding a first area and a second seal ring surrounding a second area; and
    forming a second layer on the first layer, the second layer including a metal interconnection for wiring one of the first and the second areas,
    wherein one of the first area and the second area is selectively chosen by disconnecting the first area or the second area from the second layer.

2. The method of claim 1, wherein the first area is smaller in size than the second area.

3. The method of claim 1, wherein the first area is located within the second area.

4. The method of claim 1, wherein the first layer is a front end of line (FEOL) layer or a back end of line (BEOL) layer.

5. The method of claim 1, further comprising:
    a cutting line placed outside the first seal ring to surround the first area.

6. A semiconductor chip comprising:
    a silicon layer;
    a first layer formed on the silicon layer, the first layer including a first seal ring surrounding a first area and a second seal ring surrounding a second area; and
    a second layer formed on the first layer, the second layer including a metal interconnection for wiring one of the first and the second areas,
    wherein one of the first area and the second area is selectively chosen by disconnecting the first area or the second area from the second layer.

7. The semiconductor chip of claim 6, wherein the first area is smaller in size than the second area.

8. The semiconductor chip of claim 7, wherein the first area is located within the second area.

9. The semiconductor chip of claim 6, wherein the first layer is a front end of line (FEOL) layer or a back end of line (BEOL) layer.

10. A method of fabricating a plurality of semiconductor chips, comprising:
    forming a base layer;
    forming a first layer on the base layer, the first layer including a first barrier disposed about a first area and a second barrier disposed about a second area;
    forming a second layer on the first layer, the second layer including a metal interconnection for wiring one of the first and the second areas; and
    separating a portion of the second area from the first area along a portion of the first barrier,
    wherein one of the first area and the second area is selectively chosen by disconnecting the first area or the second area from the second layer.

11. The method of claim 10, wherein the first and the second barriers completely surround the respective first and the second areas.

12. The method of claim 11, wherein the first and the second barriers are of square or rectangular shapes.

13. The method of claim 12, wherein the first and the second barriers are concentrically disposed with each other.

14. The method of claim 13, wherein the separating comprises one of breaking, shearing, nibbling, punching, routing and sawing along the portion of the first barrier.

15. The method of claim 14, wherein the first layer is a front end of line (FEOL) layer or a back end of line (BEOL) layer.

16. The method of claim 12, wherein the first area of the first barrier and the second area of the second barrier do not overlap.

* * * * *